Figure 1:
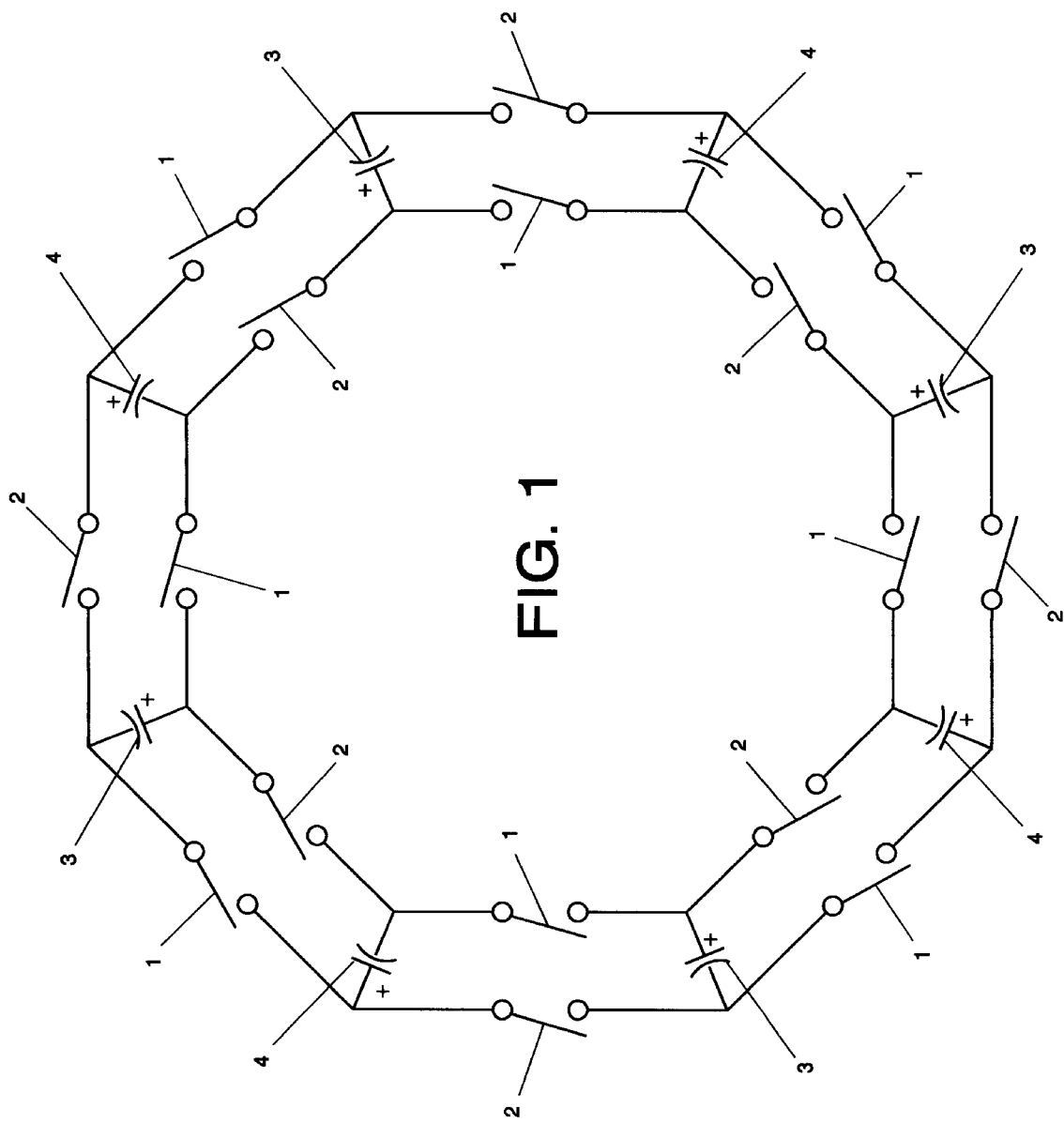

United States Patent [19]
Herrick

[11] Patent Number: 6,069,413
[45] Date of Patent: May 30, 2000

[54] APPARATUS FOR GENERATING AN ALTERNATING MAGNETIC FIELD

[76] Inventor: Kennan C. Herrick, 2160 Mastlands Dr., Oakland, Calif. 94611

[21] Appl. No.: 09/179,377

[22] Filed: Oct. 26, 1998

[51] Int. Cl.[7] .................................................. H03K 3/53
[52] U.S. Cl. .......................... 307/104; 307/107; 307/108; 307/109
[58] Field of Search ................................... 307/104, 107, 307/108, 109, 98; 361/3, 155

[56] References Cited

U.S. PATENT DOCUMENTS

| | | | |
|---|---|---|---|
| 4,035,745 | 7/1977 | Doetsch et al. | 330/262 |
| 4,079,265 | 3/1978 | Woodburn | 307/108 |
| 4,242,594 | 12/1980 | Jensen | 307/98 |
| 4,678,927 | 7/1987 | Stein et al. | 307/104 |
| 5,940,262 | 8/1999 | Archer | 361/155 |

*Primary Examiner*—Albert W. Paladini

[57] ABSTRACT

An apparatus for producing an alternating magnetic field by arraying a plurality of charged storage elements e.g. capacitors and a plurality of connecting elements e.g. transistors spatially around a physical area of magnetic field generation and in such a series circuit that electric current flows in one direction through the storage elements and in alternating directions around the physical area; and with pairs of the connecting elements interconnected with over-voltage protection elements.

7 Claims, 3 Drawing Sheets

APPARATUS FOR GENERATING AN ALTERNATING MAGNETIC FIELD

1. FIELD OF THE INVENTION 1.1 This invention relates to the generation of magnetic fields, having periodically-alternating north-south polarity, by means of electronic circuits. Applications include the generation of electric potentials in self-resonant or other electric coils by virtue of magnetic induction from such fields.

2. BACKGROUND ART 2.1 The technique of inducing electric voltage in a wire coil or solenoid (a "secondary") by transformer action involving magnetic induction from another electric coil (a "primary") is so well known to the art as not to require further description. In some instances of such induction it is desired that the frequency of the induced voltage be essentially the same as the self-resonant frequency of the secondary coil so as to maximize the voltage produced from that secondary coil. An example of such an application is the well-known high voltage "flyback" transformer that is incorporated within every television receiver that includes a cathode-ray tube.

2.2 In some other applications, operating at self resonance or not and where the required output power or voltage is relatively large, some combination of high primary-to-secondary turns-ratio and often-expensive, bulky or electrically-dangerous primary apparatus can be required in order to realize the required output. The present invention teaches a novel method for alleviating some of that requirement. The method has been made more practicable in recent years particularly by the development of a superior type of transistor known as a power MOSFET (for "metal-oxide field-effect transistor").

3. DISCLOSURE OF THE INVENTION 3.1 In an electric transformer from the output of which it is desired to obtain a relatively high voltage, the primary-to-secondary turns-ratio must be high, as is known. Often at the same time, the voltage applied to the primary must also be relatively high in order to compensate for practical limits in turns ratio, quantity of primary turns and a limitation in self-resonance amplification if any. As an example, if a 2,000,000 volt potential is required from the secondary coil and there exists practical limits, say, of 1000 for turns of wire in the secondary coil and a factor of 2 for the voltage amplification available due to secondary self-resonance, then the required primary voltage per turn of primary wire will be 2,000,000 divided by 1000 and then divided by 2, or 1000—assuming, of course, perfect transformer action. But if a practical limit in the minimum quantity of primary turns of wire is taken to be, let us say, 5, then the voltage applied to the overall primary must be 5000 and not 1000 to realize the same output. That is too high a voltage to be accomodated by today's readily-available power transistors.

3.2 If the primary coil could be reduced to just 1 turn, then the required voltage of 1000 could conceivably be provided and controlled using some currently-available power transistors; although, due to transient larger voltages that inevitably become present in such a situation, such transistors would have to exhibit actual voltage ratings of at least 2 or 3 times that 1000 volts in order to avoid failure. But if just a 1-turn coil were to be utilized, other problems would arise because of the then-relatively-large inductances of the circuits and components used to drive that 1 turn. Those inductances would act to diminish the voltage that actually becomes applied to the 1-turn primary coil and thus to diminish the output voltage from the apparatus.

3.3 Another practical disadvantage of trying to utilize just 1 turn of primary conductor is that, its inductance being necessarily relatively low because it has just 1 turn, the electric current required in order to develop, say, that hypothetical 1000 volts could become prohibitively large. For example, at a frequency of 100 KHz, the inductive reactance of a 1-turn primary might be on the order of ⅓ ohm. Neglecting circuit resistance (the inevitable presence of which will also diminish the resulting output voltage, of course), one would need the driving circuit to deliver a current of 3000 amperes or so—at 100 KHz—in order to develop the required 1000 volts. That is a tall order indeed for today's power transistors.

3.4 But staying with the notion of a 1-turn primary coil or equivalent circuit, if means could be found to a) diminish the voltage applied to the driving transistor(s), b) diminish the deleterious effect of extraneous circuit inductances and c) diminish the current required to be conducted by the driving transistor(s), then a 1-turn configuration, driven by transistors, could become practicable. That is the object of the present invention.

3.5 A particular configuration of the present invention, described herein, incorporates power MOSFET transistors although other types of transistor such as bipolar could be used by incorporating suitable circuits used therewith that are known to the art. Realization of the present invention is not dependent on the use of power MOSFETs. But power MOSFETS have the happy characteristics of a) being readily amenable to operating in parallel combinations, in order thereby to augment the current-handling capability of their circuits; b) requiring relatively low-power and simple circuits to turn them on and off; and c) being capable of turning on and off very rapidly.

3.6 The fundamental notions of the present invention are a) to incorporate multiple power MOSFETs as switching elements into two 1-turn "coils", which actually are more precisely characterized as current-loops; and b) to facilitate incorporation of all the electric elements of the current loops physically into the loops themselves so that their inevitable respective inductances can help to contribute to the inductances of the loops, in inducing magnetic flux into the secondary coil or other apparatus. Two current loops are employed since a) transistors will normally only conduct current in one direction and b) it is necessary, of course, in a transformer arrangement, to have primary current flow alternately in one direction and then in the other. One of the present invention's current loops provides current pulses in one direction while the other loop, directly physically adjacent to and actually incorporating some of the same components as, the first loop, provides the current pulses in the opposite direction. In that way the resultant alternating current pulses in the two loops generate the desired alternating magnetic field. The secondary-a conventional coil of wire in most cases of use-is positioned directly adjacent to and coaxial with the current-loop pair, receives the magnetic flux generated thereby, and delivers its output voltage.

3.7 The embodiment of the invention to be described in detail incorporates 8 identical segments making up the dual current loop; but any convenient quantity could be utilized in a practical design.

4. BRIEF DESCRIPTION OF THE DRAWINGS 4.1 FIG. 1 is a simplified conceptual drawing of an 8-section dual current loop.

Figure 2:
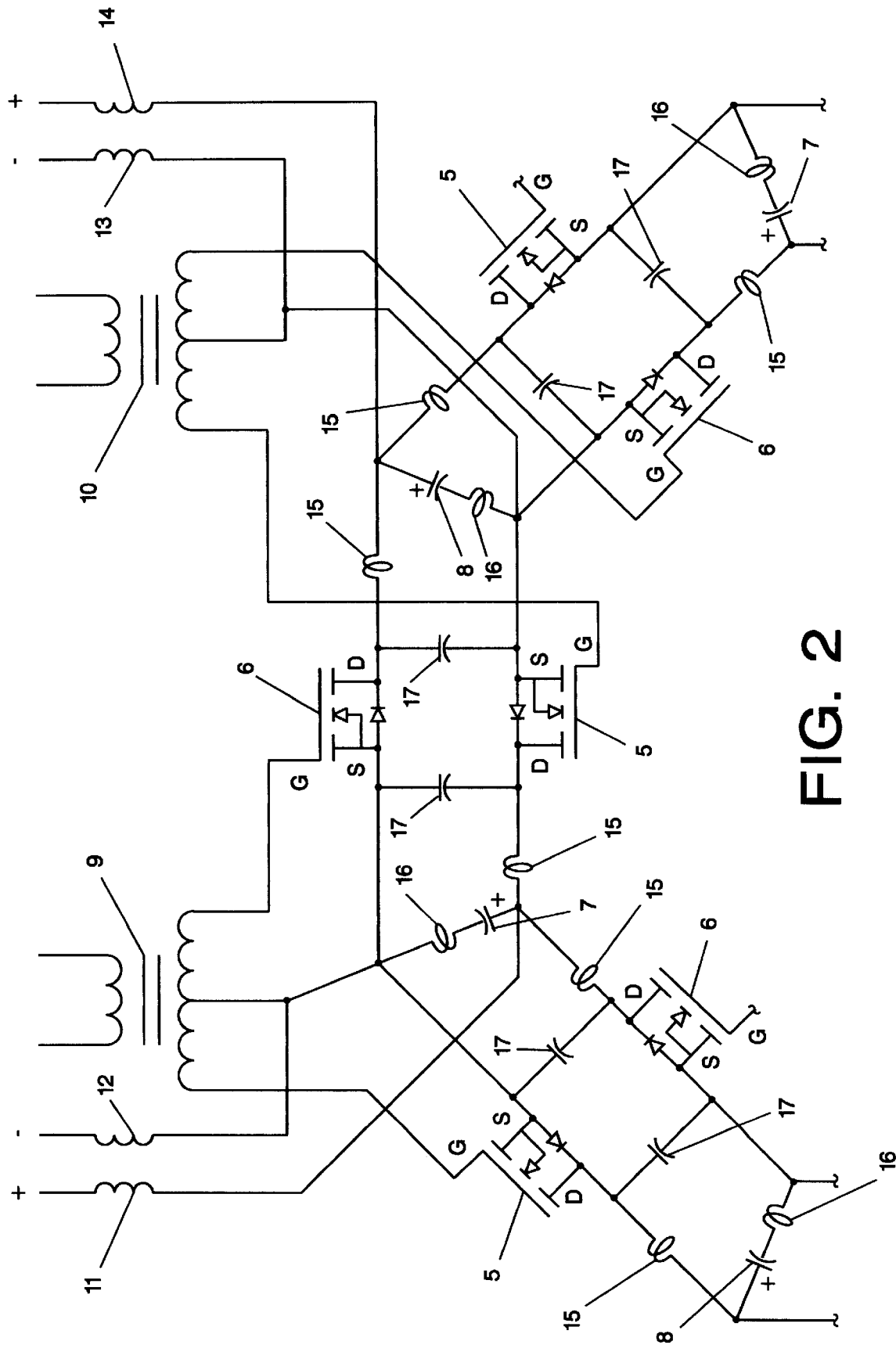

4.2 FIG. 2 is an electrical schematic drawing showing a portion of the current-loop circuit in more detail.

Figure 3:
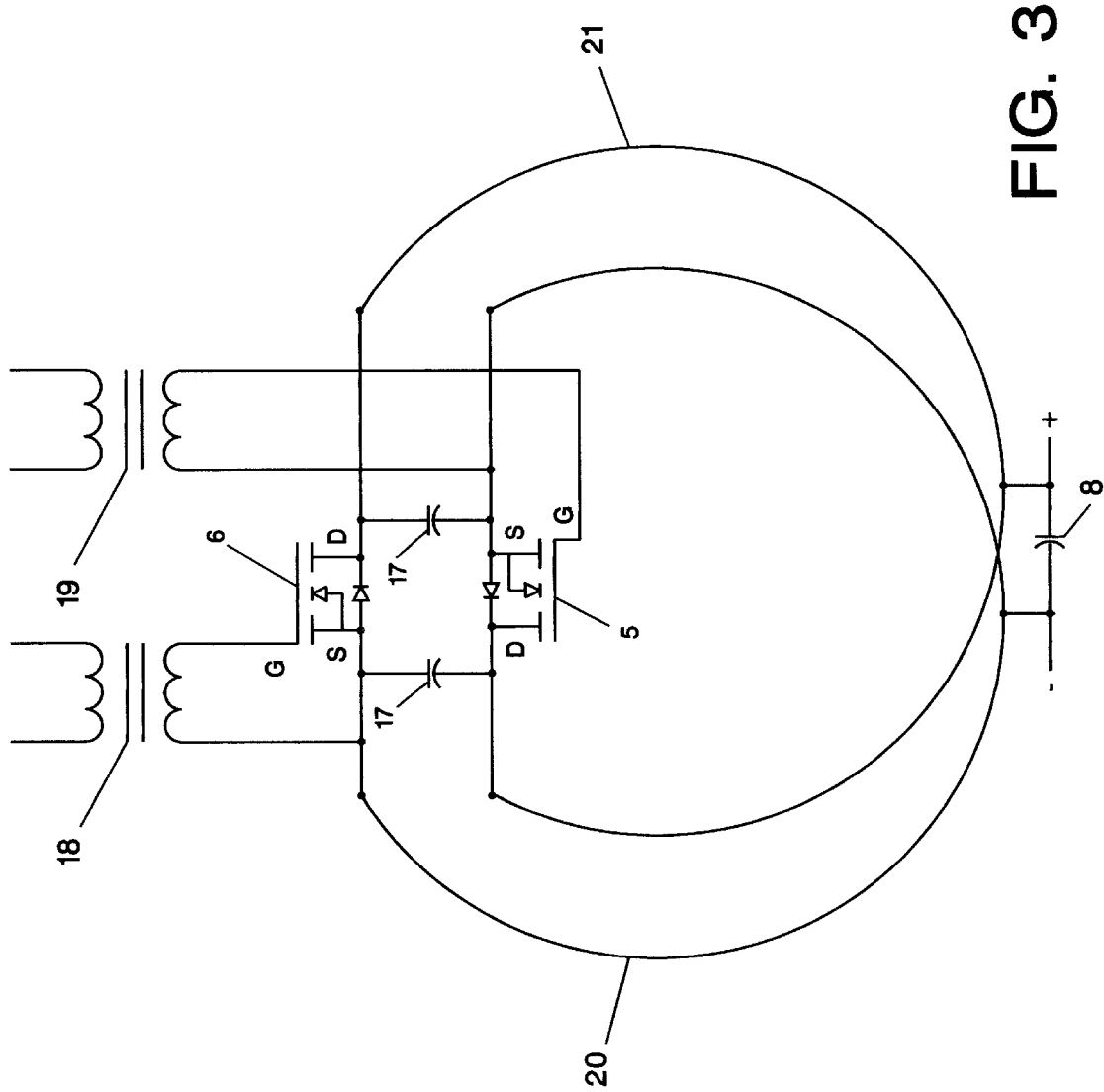

4.3 FIG. 3 is an electrical schematic drawing of a dual current loop incorporating just one section.

5. BEST MODE FOR CARRYING OUT THE INVENTION 5.1 Refer first to FIG. 1, the simplified conceptual drawing of the dual current loop. Switches 1 and 2, eight of each, are arrayed physically in a loop surrounding the area through which the generated magnetic field is to pass, the field passing in the direction perpendicular to the page of the drawing. Capacitors 3, of which there are four, are connected, if of the polarized variety as shown, with their positive terminals "inside". Capacitors 4, of which there are again four, are similarly connected with their positive terminals "outside". The capacitors are kept charged by means not shown in FIG. 1.

5.2 In operation, current is caused to flow around the overall loop in alternating directions by first closing all switches 1 simultaneously, then opening them and closing switches 2 simultaneously and so forth. A complete current path around the loop can readily be traced, for either direction, by following a path from any "+" capacitor terminal, say, through a closed switch 1 or switch 2, to the next capacitor's "−" terminal, and so forth back to the starting point.

5.3 For each direction of current flow, the set of capacitors is, in effect, all shorted together, in series, by the switch-sets 1 or 2. But the current flow is limited by a) the intrinsic inductive reactance and resistance of the electrical conductors making up a loop, b) the residual inductive reactance and resistance of each of the capacitors and c) the inherent resistance of the switches. Since all the components in the current paths are physically located in close proximity to the area of predominant magnetic flux, their residual inductances will tend to add their respective magnetic fluxes, if they are properly oriented, to the overall flux passing through the area of interest.

5.4 Notice that current flow through all capacitors 3 and 4 is always in the same direction. That implies that they may be kept charged with direct current from a common external source, a source suitably isolated from the alternating potentials that will be present on each capacitor, during operation, with respect to that source. These capacitors may also, for that reason, be of the polarized type, e.g. electrolytic, for maximizing their energy-storage capability.

5.5 The purpose of generating the magnetic flux is, of course, under ordinary circumstances to induce a voltage into an adjacent secondary coil of wire. Such secondary is to be located, referring to FIG. 1, directly above or below the plane of the (primary) loop-circuit with its axis concentric with the center of that plane.

5.6 Aside from the above-described advantage, there are these additional advantageous features of the invention:

5.6.1 If all capacitors are kept charged to the same voltage, for an example, then the overall voltage applied to the loops is, in the case of FIG. 1, eight times the individual capacitor voltage.

5.6.2 Any switch, when open, "sees" only the voltage of a single capacitor (assuming equal capacitor voltages) and thus need be rated to accomodate only that voltage; but in practicality, of course, its transistor analog in the real world will be rated to accomodate the somewhat larger voltage that will inevitably appear across it due to other circuit considerations.

5.6.3 In an actual realization of this circuit, other capacitors may readily be paralleled with the individual ones shown so as to increase the energy-storage capacity. And other switches (e.g., transistors) may readily be paralleled with those shown so as to increase the overall current-handling capability.

By these means the objectives of a) increasing the voltage applied to the primary circuit and b) reducing the voltage-withstanding and current-handling requirement of the switches (e.g. transistors) may readily be met.

5.7 Refer now to FIG. 2, the schematic drawing showing a portion of the current-loop circuit in more detail. This shows three sections of an eight-section dual-loop and incorporates power MOSFET transistors in place of the switches represented in FIG. 1 together with specific coupling means both for maintaining charge in the capacitors and for driving the transistors.

5.8 The three transistors identified by 5 replace three of the switches 1 in FIG. 1. The three transistors identified by 6 replace three of the switches 2 in FIG. 1. The two capacitors identified by 7 replace two of the capacitors 3 in FIG. 1. The two capacitors identified by 8 replace two of the capacitors 4 in FIG. 1. The gates of each 5–6 transistor pair whose source terminals are connected to the same capacitor 7 or 8 are driven oppositely from a transformer, one such transformer shown as 9 and another as 10. Each MOSFET transistor is shown as incorporating an intrinsic diode; the presence of these or equivalent diodes is important to the proper operation of the circuit and their incorporation in the circuit is a feature of this invention. Clearly, discrete diodes could be employed when using transistors that might lack such intrinsic diodes.

5.9 Each capacitor 7 or 8 is kept charged through a pair of inductors; two sets of these are shown in FIG. 2 as 11–12 and 13–14. The purpose of these inductors is to isolate the capacitors from the external source(s) of dc power, by virtue of their inductive reactances, when the circuit is operating. The transistor driving-transformers serve the same purpose of isolation in addition to their purpose of coupling the driving signal(s) to the transistor gate circuits.

5.10 Each inductor 15, of which six are shown in FIG. 2, represents the intrinsic inductance of those portions of the interconnecting current paths that lie between the +terminal of each capacitor 7 or 8 and the respective drain terminal of each connected transistor. Each inductor 16, of which four are shown, represents the intrinsic inductance of that portion of the interconnecting current path that lies between the "−" terminal of each capacitor 7 or 8 and the source terminals of both of the connected transistors and the center-tap of their gate-driving transformer; proper physical layout using known means can assure that any residual loop-inductances in the current paths that comprise the gate circuits remain small, so as not to interfere with the gate-drive signals.

5.11 Capacitors 17, of which six are shown, act together with the respective intrinsic diodes of transistors 5 and 6 (or substitute discrete diodes) in a way that is a feature of this invention. These capacitors have much smaller capacitance than the capacitors 7 and 8; in a typical system, such value might be 2–4 microfarads each whereas the capacitance of capacitors 7 and 8 might be 4000–8000 microfarads each.

5.11.1 As is known, whenever current flow through an inductor is interrupted, the collapsing magnetic field of that inductor acts to generate a voltage of such polarity as to tend to maintain the current flow In the instant circuit, such action will tend to impose a voltage "spike" across each transistor as it periodically turns off in interrupting its current flow. Without some protection against that voltage spike, the transistors may be destroyed since the magnitude of the transient voltage can be many times the voltage level normally present.

5.11.2 In FIG. 2 it can be seen that, for each pair of transistors 5–6, its associated pair of capacitors 17 act to couple—for ac, or the frequency components of such a spike—the intrinsic diode of the non-conducting transistor to the drain-source terminals of the turning-off transistor in such polarity as to conduct current when voltage appears across the turning-off transistor. That action will tend to diminish in amplitude the voltage spike appearing across the turning-off transistor, such diminution being a function of the capacitance of capacitors 17 as related to the inductance of the overall current loop. In this way, each MOSFET transistor (or substitute transistor's associated discrete diode) protects its "partner" from excess voltage. Capacitors 17 are to be located physically close to their respective transistors so as to maximize the beneficial effect described.

5.11.3 There will be signal-frequency currents passing through capacitors 17 just as through capacitors 7 and 8, and those currents will act undesirably to diminish the desired loop current, but only negligibly because of the great disparity in capacitance of 17 as against 7 and 8.

5.12 By visualizing the alternating current paths in the same manner as when considering FIG. 1, it can be seen that loop current will flow always in the same direction through capacitors 7 and 8 and inductances 16 (so that those inductances actually will not contribute to the overall inductance of the loop since they do not "see" alternating current); and alternately through the paths comprising transistors 5 and their associated drain-path inductances 15 on the one hand and transistors 6 and their associated drain-path inductances 15 on the other.

5.13 In an actual configuration all of the components typified by FIG. 2 may conveniently be mounted on a set of stacked printed-circuit boards, suitably arrayed in an octagonal configuration in the case of the eight loop-segments of FIG. 2, and against which array the secondary coil or other apparatus of the overall assembly may be placed.

5.14 In an actual configuration the dc power applied via inductors 11–12 and 13–14 may be supplied in various ways that are known to the art. Similarly, the driving signals applied to the gate-transformers 9 and 10 may be so supplied; and in fact power-coupling and signal-driving means other than inductors and transformers may be employed, as is known. In addition, by known means various configurations of secondary coils, or other items to which the alternating magnetic field is to be applied, can readily be incorporated into a specific apparatus.

5.15 Refer now to FIG. 3, the electrical schematic drawing of a dual current loop incorporating just one section. Items 5, 6, 8 and 17 perform functions previously described in connection with FIG. 2. Signal-supplying transformers 18 and 19 replace transformers 9 and 10 of FIG. 2 since only "single-ended" drive signals are required. Dc power-coupling inductors typified by items 11, 12, 13 and 14 of FIG. 2 need not required in this configuration since a "ground-reference" may conveniently be established at the location of the enegy-storage capacitor 8. In a typical configuration, capacitor 8's negative side may be considered at "ground" and its positive side may then be kept charged utilizing known means.

5.15.1 Items 20 and 21 represent the two current loops of the circuit. By tracing a current path starting, say, at the positive side of capacitor 8, through one loop or the other and its connecting transistor 5 or 6, it can be seen that current will flow, as it does in reference to the circuit of FIG. 2, first in one direction and then in the other. Further, as decribed in reference to FIG. 2, capacitors 17 act in the same manner in affording protection for transistors 5 and 6 during signal transitions.

What is claimed is:

1. A device for generating an alternating magnetic field comprising
    a charged electric energy-storage element and
    a plurality of electric connecting elements
    said energy-storage elements and said connecting elements being arrayed spatially in proximity to and surrounding a physical area of magnetic field generation; and
    said energy-storage elements and said connecting elements in a closed series electric circuit in a manner such that the resultant current thereof flows in a first direction from said energy-storage elements and alternately in a first direction around said area of field generation and in a second direction around said area; and
    pairs of said connecting elements interconnected with protection elements to protect each member of said pair from over-voltage.

2. The device of claim 1 wherein said energy-storage elements are capacitors.

3. The device of claim 1 wherein said connecting elements are transistors.

4. The device of claim 3 wherein said transistors are metal-oxide semiconductor field-effect transistors (MOSFETs).

5. The device of claim 1 wherein said interconnecting means are capacitors.

6. The device of claim 1 wherein said protection elements are diodes.

7. The device of claim 6 wherein said diodes are the intrinsic drain-to-source diodes of metal-oxide semiconductor field-effect transistors (MOSFETs).

* * * * *